United States Patent [19]
Davis et al.

[11] 4,422,162
[45] Dec. 20, 1983

[54] NON-DISSIPATIVE MEMORY SYSTEM

[75] Inventors: Walter L. Davis, Plantation; Douglas R. Kraul, Sunrise, both of Fla.

[73] Assignee: Motorola, Inc., Schaumburg, Ill.

[21] Appl. No.: 192,678

[22] Filed: Oct. 1, 1980

[51] Int. Cl.³ ............................................. G11C 11/40
[52] U.S. Cl. ..................................... 365/227; 365/226
[58] Field of Search ............... 365/222, 203, 211, 226, 365/227

[56] References Cited

U.S. PATENT DOCUMENTS

| | | | |
|---|---|---|---|
| 3,641,511 | 2/1972 | Cricchi et al. | 365/189 |
| 3,644,904 | 2/1972 | Baker | 365/154 |
| 3,680,061 | 7/1972 | Arbab et al. | 365/230 |
| 3,688,280 | 8/1972 | Ayling et al. | 365/227 |
| 3,721,964 | 3/1973 | Barrett et al. | 365/174 |
| 3,740,730 | 6/1973 | Ho et al. | 307/238 |
| 3,753,242 | 8/1973 | Townsend | 365/230 |
| 3,795,898 | 3/1974 | Mehta et al. | 365/227 |
| 3,859,637 | 1/1975 | Platt et al. | 365/227 |
| 4,174,541 | 11/1979 | Schmitz | 365/227 |

Primary Examiner—Terrell W. Fears
Attorney, Agent, or Firm—Joseph T. Downey; Edward M. Roney; James W. Gillman

[57] ABSTRACT

A memory system is used to store data and is powered-up by and only during accessing signals, thus using essentially no current when not being accessed. The memory system includes a decoding network using a mixture of NPN and PNP transistors, and a buffer circuit at the input to a memory cell array allows the use of a minimum number of select lines, having low power requirements.

15 Claims, 4 Drawing Figures

PART OF DECODER 10 | PART OF BUFFER 14

NON-DISSIPATIVE MEMORY SYSTEM

BACKGROUND OF THE INVENTION

This invention relates to the field of semiconductor memory devices and, more particularly, to a memory system requiring a minimum of select lines while using power only when accessed.

Semiconductor memories are, of course, well known in the art and are widely used commercially. In general, they consist of an input decoding network and a memory array, with the decoder functioning to select a specific portion of the memory and cause the information in that portion to be made available at one or more outputs of the array. The need to design devices using minimum power have led to the development of memory elements which do not dissipate power unless they are accessed. However, because of design problems related to decoder power-up delays, it has not been possible to combine input decoding with minimum power dissipation while retaining the capability of immediate response to input select signals.

SUMMARY OF THE INVENTION

It is therefore an object of the present invention to provide a memory array as for a low or battery powered device which requires a minimum number of select lines while using minimum power when operating, and substantially zero power when not accessed.

It is a particular object to provide such an array which is also field programmable.

These objects and others which will become apparent are provided in the present invention by using a simple decoding network to minimize the number of select lines required for access, with power being supplied by the select signals. The decoder is coupled to a memory array which also does not require power unless accessed by the decoder.

DETAILED DESCRIPTION OF THE PREFERRED EMBODIMENT

Figure 1:
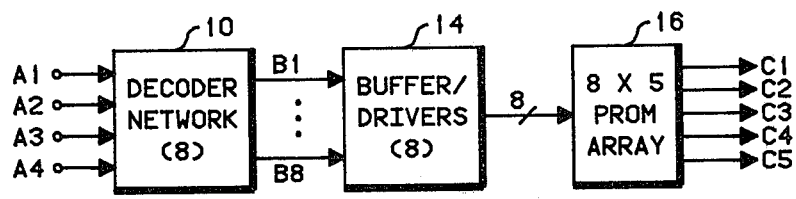
FIG. 1 is a block diagram of the complete system of the invention.

In the preferred embodiment of FIG. 1, the system of the invention is shown as an eight-word memory with five bits per word. There are four inputs A1-A4 coupled to a decoder network 10 which include eight decoding cells with eight word accessing output terminals B1-B8 coupled to a block 14 which includes eight buffer/drivers. The eight outputs of the block 14 are coupled to an 8×5 array 16 of memory cells. The five outputs of the array 16 are designated as C1-C5. When the code at the power/select inputs A1-A4 indicates that a given word is to be read from the memory array 16 sufficient power is derived from the power/select inputs to activate that portion of the decoder necessary to achieve decoding and the appropriate word accessing terminal of the group B1-B8 is enabled. As is known, at the array outputs C1-C5 the five bits corresponding to the given word will appear.

Figure 2:
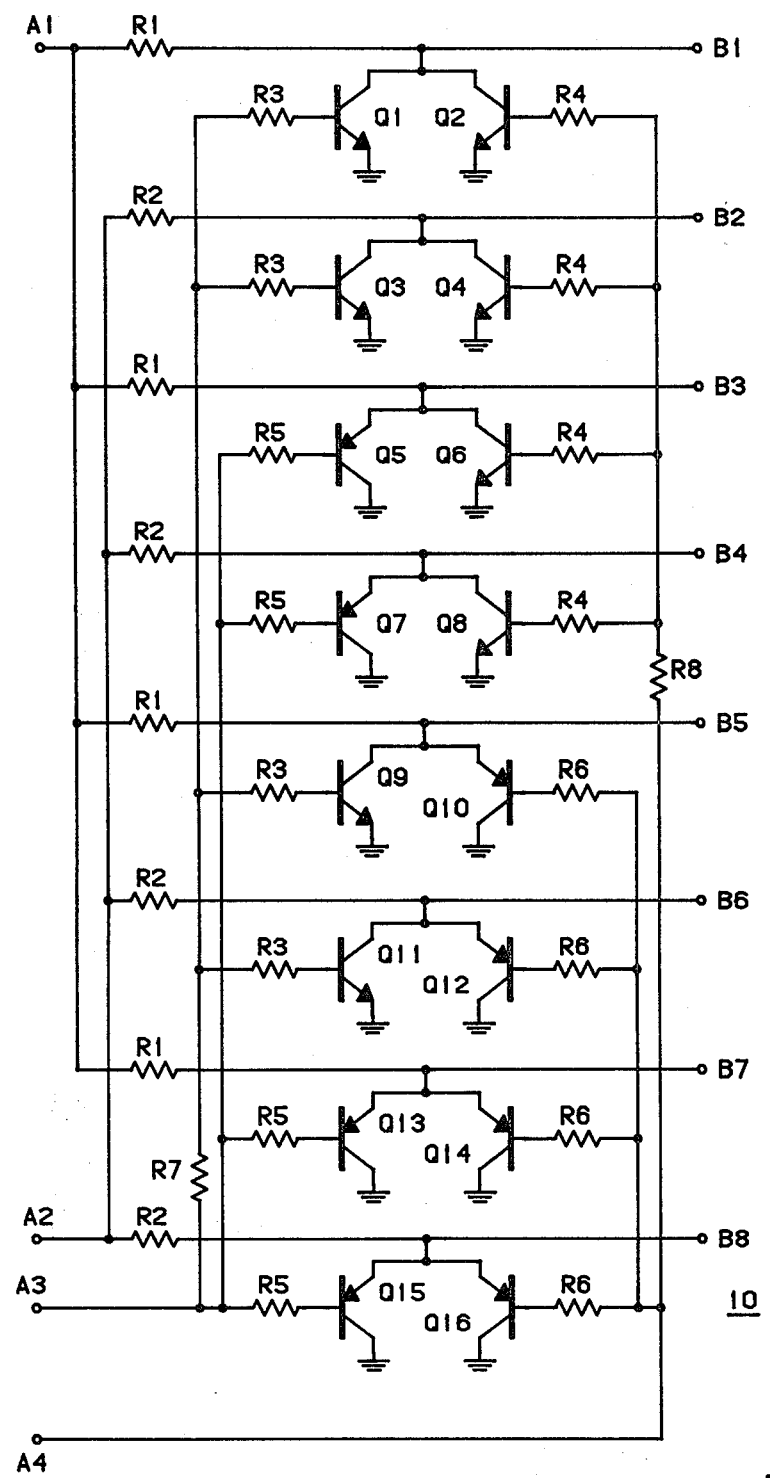
FIG. 2 is a circuit diagram of the decoder network of FIG. 1.

FIG. 2 shows in detail the schematic diagram of a preferred embodiment of the decoder network 10. As in FIG. 1, the network has four inputs and eight outputs, thus selecting ones of the eight stored words using only four select lines. It will be apparent throughout this description that the number of words, and bits per word, are exemplary only and are not to be construed as limiting in any way.

The decoding network 10 serves two purposes: powering-up the chip and selecting one of the eight words. The network comprises eight pairs of transistors Q1-Q16, divided into two sets of one-of-four decoders. The pairs of transistors are made up of the four possible combinations of PNP and NPN transistors as shown, and the decoding operation will be discussed further below. The associated resistors are referenced as groups of resistors R1-R8 with all members of a group having the same value. Each set of decoders is powered-up by the respective "power/select" input terminal A1 or A2, and no power is used by a decoder when its input terminal is not energized. Only one of the terminals A1, A2 will be energized at any one time. If neither A1 nor A2 is energized, no power will be dissipated. Each pair of transistors (Q1-Q16) is coupled to the "select" input lines A3 and A4 for decoding the signals on those inputs. The outputs B1-B8 of the array 16 will be in accordance with the truth table given below. For example, when A1=1, A2=0, A3=1 and A4=0, only the one output terminal B3 will go high, indicating that word three in the memory block 16 has been selected. The truth table, however, only applies to the one specific embodiment of the array 10 shown in FIG. 2 and is not to be construed as limiting the invention in any way.

TRUTH TABLE

| Inputs | | | | High |
|---|---|---|---|---|
| A1 | A2 | A3 | A4 | Output |
| 1 | 0 | 0 | 0 | B1 |
| 0 | 1 | 0 | 0 | B2 |
| 1 | 0 | 1 | 0 | B3 |
| 0 | 1 | 1 | 0 | B4 |
| 1 | 0 | 0 | 1 | B5 |
| 0 | 1 | 0 | 1 | B6 |
| 1 | 0 | 1 | 1 | B7 |
| 0 | 1 | 1 | 1 | B8 |
| 0 | 0 | X | X | — |

Figure 4:
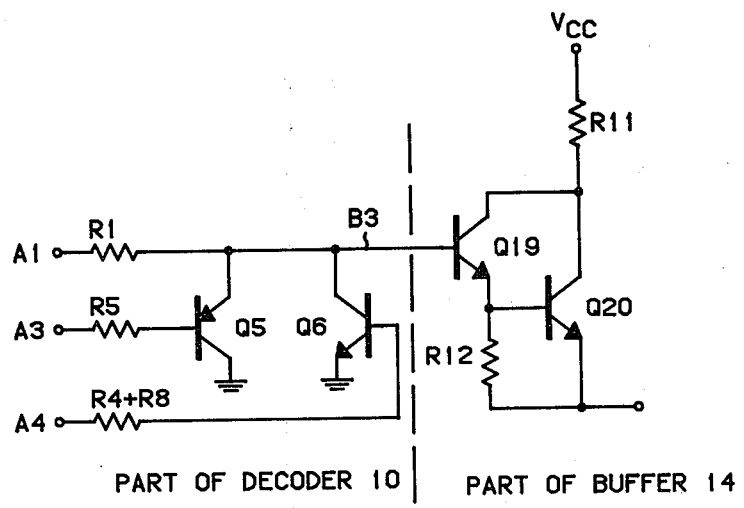
FIG. 4 is a detailed diagram taken from FIGS. 2 and 3.

Further discussion of the decoding function will be found with respect to FIG. 4.

Figure 3:
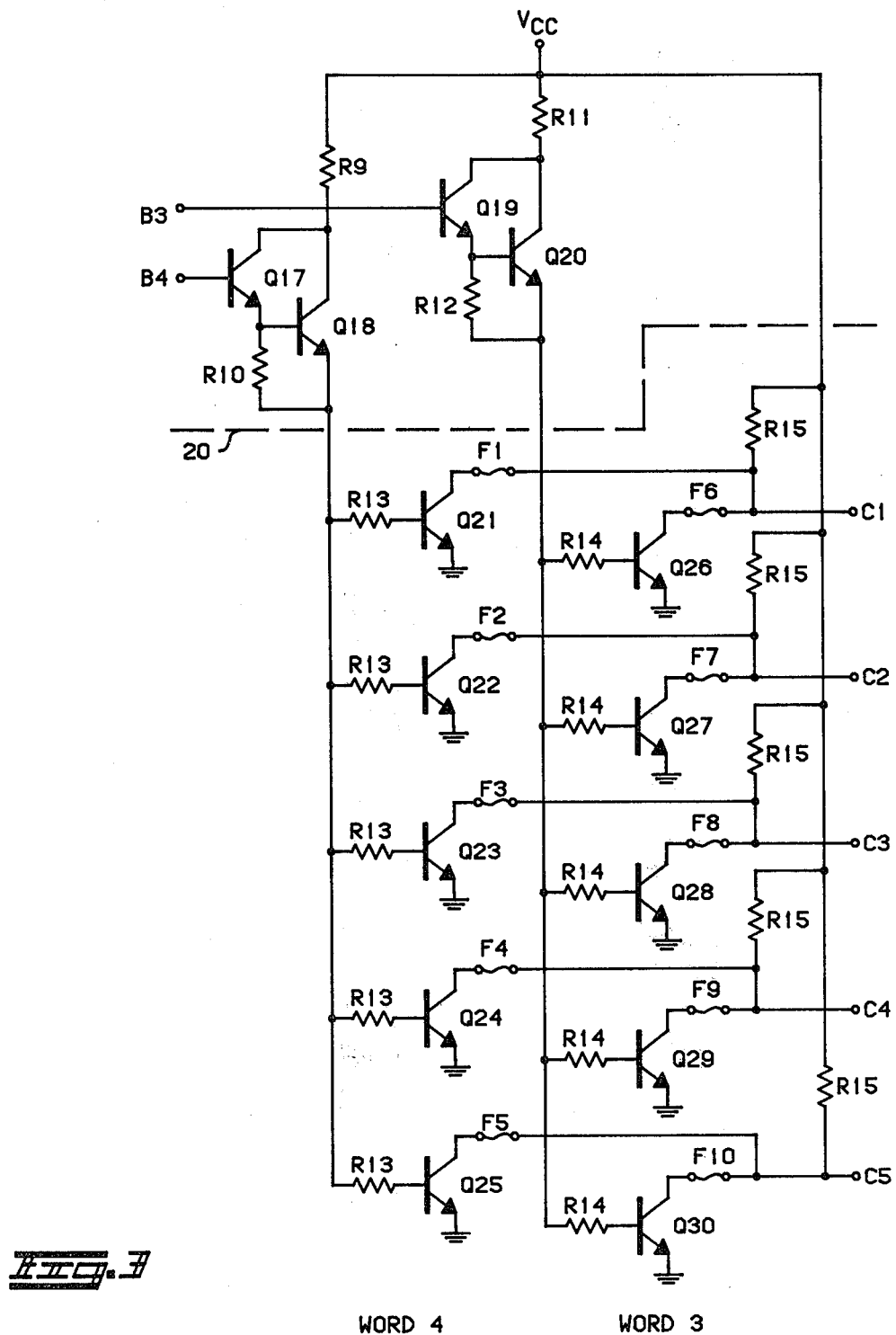
FIG. 3 is a circuit diagram of one two-word cell and associated buffers of FIG. 1.

FIG. 3 combines one two-word (words three and four) memory cell (below the dashed line 20) and the two associated buffer/drivers (above line 20). Transistors Q17 and Q18 with R9 and R10 make up one buffer/driver, transistors Q19, Q20 with R11, and R12 make up the other, while transistors Q21-Q25 and resistors R13 are the elements of one half a memory cell and transistors Q26-Q30 with resistors R14 comprising the other half, with resistors R15 coupled to both halves of the cell. When input B3 in enabled, each of the outputs C1-C5 is either pulled up to supply voltage or pulled down to ground, depending on whether the respective collector circuits of transistors Q26-Q30 are open or closed. The fuses F1-F10 may represent the field-programmable fuses of a PROM or the collector connections of an integrated circuit ROM which are made open or closed during manufacture. It is also within the scope of the invention to utilize the system with semipermanent memories such as RAM's. As is known, the pattern of ones and zeros on the outputs C1–C5 can represent the five bits of a binary "word" and may be used in any desired fashion. The entire device, for example, could serve as the "code plug" of a pocket pager, but is not limited thereto.

It is to be noted that if the array 16 is not a PROM, the buffer/driver 14 would be omitted and replaced, e.g., by a simple diode circuit, since no programming current need be provided for.

FIG. 4 includes a portion of each of the decoder 10 and buffer/driver 14 of FIGS. 2 and 3. Transistors Q19 and Q20 form a high current gain buffer which provides the base drive current to the transistors Q26–Q30 (FIG. 3). When the base of Q19 is driven below the turn-on threshold by the voltage on B3 (through resistor R1), both transistors Q19 and Q20 are off. Since only leakage current can flow in the collector circuits of transistors Q19 and Q20, the transistors Q26–Q30 cannot be activated. To this basic buffer select line (B3) are coupled the pair of transistors Q5 and Q6 of the decoder 10, specifically, the emitter of Q5 and the collector of Q6. The base of Q5 is coupled through the resistor R5 to input A3 and the base of Q6 is coupled through resistors R4 and R8 to input A4. In one embodiment, the resistor values are: R1=50k, R4=5k, R5=5k and R8=50k. The collector of Q5 and the emitter of Q6 are coupled to ground. The Q5–Q6 combination thus forms a logical NOR with the signal from A3 inverted. If either Q5 or Q6 is conducting, no current can enter the base of Q19 and the line B3 is effectively disabled, thus word three cannot be selected, and if A1 is at or near ground potential, the decoder will be using essentially no power.

Referring back to FIG. 2, it will be seen that each of the pairs of transistors in one set of decoders in the network 10 is a different combination of PNP and NPN transistors. Each pair of transistors performs the logical NOR function with appropriate input inversions to achieve the four combinations of two input signals required. The combination of transistor types causes no problems in the manufacture of the semiconductor device, since the PNP transistors may be of the substrate type.

In normal operation, such a system would typically require a three volt supply and would use 500 $\mu$a (nominal current) only when the memory is being addressed, and 10 $\mu$a or less in the standby mode. Thus, it will be seen that, with the elements of the system requiring almost no power except during the very brief accessing pulses, a considerable battery drain is eliminated. Obviously, if the memory cells are field programmable, appropriate voltage and current must be provided for programming. These may be on the order of 10 volts, 50 milliamps for a period not greater than 50 milliseconds. This power, though slight, can be supplied to a PROM by a separate programming supply.

The decoder/buffer combination allows a PROM in a low voltage, current input device to be programmed since, in reading Word 3, for example, Q19 would conduct and Q20 would not, thus requiring a minimum of current. In programming Word 3, both Q19 and Q20 would conduct, allowing enough current to be supplied at B3 to blow the appropriate fuses in the fuse group F6–F10.

Thus there has been shown and described an array of memory cells operating on a minimum current and at low voltage, while requiring a minimum of select lines. It will be apparent that various arrangements of the invention are possible and it is intended to cover all which fall within the spirit and scope of the appended claims.

What is claimed is:

1. A memory system for a low powered device and comprising:
    multiple input terminals for selectively supplying memory addressing signals;
    decoder means coupled to and deriving all power from said memory addressing signals, providing ones of a predetermined number of separate word accessing signals in response to predetermined combinations of said input memory addressing signals;
    a plurality of output terminals; and
    an array of memory cells coupled to the decoder means and each cell providing predetermined signals at each of the output terminals in response to a respective one of the word accessing signals.

2. A memory system in accordance with claim 1, wherein the decoder means comprises at least one group of transistor pairs, each pair of one group comprising a different combination of the two transistor types NPN and PNP, and each group of pairs coupled to a respective input terminal.

3. A memory system in accordance with claim 1, wherein each memory cell stores the bits of one binary word and comprises one section for each bit of the word.

4. A memory system in accordance with claim 3, wherein each element of each memory cell includes a circuit which may be made conductive in response to the respective word accessing signal.

5. A memory system in accordance with claim 4, wherein each said circuit includes means for preventing conduction in the circuit.

6. A memory system in accordance with claim 1 further including buffer/driver means coupled to said decoder means and enabled by the word accessing signals.

7. A memory system in accordance with claim 6 and wherein each memory cell includes a plurality of sections and each section includes a circuit which may be made conductive and field-programmable means for preventing conduction.

8. A memory system in accordance with claim 7, wherein each buffer/driver means comprises a transistor, and a received word accessing signal enables the transistor to conduct.

9. A memory system in accordance with claim 8, wherein each buffer/driver means includes a second transistor circuit coupled to provide additional current for programming the conduction preventing means.

10. A memory system in accordance with claim 6 wherein the buffer/driver means comprises a predetermined number of portions, each portion coupled to a power source and a corresponding memory cell and each portion coupled to receive one of the word accessing signals.

11. An n-word memory system for a low powered device and comprising:
    a decoder network having a first predetermined number of inputs, the first predetermined number being less than n, said terminals adapted for receiving memory addressing signals, said decoder network deriving all power required for operation from said memory addressing signals, and having n outputs for supplying word accessing signals in response to predetermined combinations of said memory addressing signals;

n buffer/driver circuits, each coupled to one of the respective decoder network outputs for being enabled by a respective word accessing signal; and n memory cells, each coupled to one of the buffer/driver circuits for being accessed in response to the word accessing signal, and having a second predetermined number of outputs, the second number being the number of bits per word in the system.

12. A logic decoding device comprising:

a plurality of input terminals for receiving encoded input signals;

decoding means coupled to said terminals, responsive to said input signals and deriving all power required for operation therefrom, for producing distinct output signals in response to each combination of said input signals; and a plurality of output terminals, distinct ones of which are activated by the presence of said input signals, whereby said decoding device draws power from and only during the presence of said encoded input signals and substantially zero power when not receiving said encoded signals.

13. The logic decoding device of claim 12 wherein said decoding means includes means for activating, in response to said input signals, only a portion of said decoding means, whereby power is also conserved during said decoding.

14. A parallel binary to plural line logic decoding device comprising:

N input terminals for receiving parallel binary encoded input signals, where N is an integer;

decoding means coupled to said N terminals, responsive to said binary encoded input signals and deriving all power required for operation therefrom, for producing distinct output signals in response to each combination of said binary encoded input signals; and $2^{N-1}$ output terminals, distinct ones of which are activated by the presence of said binary encoded input signals, whereby said decoding device draws power from and only during the presence of said binary encoded input signals and substantially zero power when not receiving said binary encoded input signals.

15. The logic decoding device of claim 1 wherein said decoding means includes means for activating, in response to said input signals, only portions of said decoding means, whereby power is also conserved during said decoding.

* * * * *

UNITED STATES PATENT AND TRADEMARK OFFICE
CERTIFICATE OF CORRECTION

PATENT NO. : 4,422,162

DATED : Dec. 20, 1983

INVENTOR(S) : Walter L. Davis et al.

It is certified that error appears in the above-identified patent and that said Letters Patent is hereby corrected as shown below:

In claim 4, column 4, line 33, delete "element" and substitute -- section --.

Signed and Sealed this

Thirteenth Day of May 1986

[SEAL]

Attest:

Attesting Officer

DONALD J. QUIGG

Commissioner of Patents and Trademarks